US008026616B2

(12) United States Patent
Hur et al.

(10) Patent No.: US 8,026,616 B2
(45) Date of Patent: Sep. 27, 2011

(54) PRINTED CIRCUIT BOARD, SEMICONDUCTOR PACKAGE, CARD APPARATUS, AND SYSTEM

(75) Inventors: Soon-yong Hur, Hwaseong-si (KR);
Mo-rae Kim, Jeonju-si (KR);
Hyeong-seob Kim, Cheonan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 413 days.

(21) Appl. No.: 12/352,056

(22) Filed: Jan. 12, 2009

(65) Prior Publication Data
US 2009/0189271 A1 Jul. 30, 2009

(30) Foreign Application Priority Data

Jan. 30, 2008 (KR) .................. 10-2008-0009675

(51) Int. Cl.
*H01L 23/52* (2006.01)
*H01L 23/48* (2006.01)

(52) U.S. Cl. .. 257/786; 257/737; 257/773; 257/E23.069

(58) Field of Classification Search .............. 257/773, 257/786, 737, E23.069
See application file for complete search history.

(56) References Cited

U.S. PATENT DOCUMENTS

| 6,958,527 | B2* | 10/2005 | Hanaoka ............... 257/668 |
| 7,579,692 | B2* | 8/2009 | Matsushima et al. ......... 257/738 |
| 2005/0017375 | A1* | 1/2005 | Ko et al. ................ 257/782 |
| 2005/0023683 | A1* | 2/2005 | Chung et al. ............. 257/738 |
| 2005/0127487 | A1* | 6/2005 | Chang .................. 257/678 |
| 2005/0230829 | A1* | 10/2005 | Watanabe et al. .......... 257/738 |

FOREIGN PATENT DOCUMENTS

| JP | 09-232736 | 9/1997 |
| JP | 2007-005452 | 1/2007 |
| KR | 10-0216839 | 6/1999 |

* cited by examiner

*Primary Examiner* — Nitin Parekh
(74) *Attorney, Agent, or Firm* — Stanzione & Kim, LLP (57) ABSTRACT

A printed circuit board providing high reliability using a packaging of high capacity semiconductor chip, a semiconductor package, and a card and a system using the semiconductor package. The semiconductor package includes a substrate having a first surface and a second surface, a semiconductor chip mounted on the first surface of the substrate, at least one land disposed on the second surface of the substrate, and whose circumference includes a plurality of first group arcs, a mask layer covering the second surface of the substrate and including at least one opening that exposes the at least one land, and at least one external terminal disposed on the at least one land, wherein a portion of the at least one land is covered by the mask layer, and a sidewall of another portion of the at least one land is exposed by the at least one opening, and the circumference of the at least one opening includes a plurality of second group arcs, and a radius of the outermost arc from among the plurality of first group arcs is equal to a radius of the outermost arc from among the plurality of second group arcs.

20 Claims, 9 Drawing Sheets

PRINTED CIRCUIT BOARD, SEMICONDUCTOR PACKAGE, CARD APPARATUS, AND SYSTEM

CROSS-REFERENCE TO RELATED APPLICATIONS

This application claims priority under 35 U.S.C. §119(a) from Korean Patent Application No. 10-2008-0009675, filed on Jan. 30, 2008, in the Korean Intellectual Property Office, the disclosure of which is incorporated herein in its entirety by reference.

BACKGROUND OF THE INVENTION

1. Field of the Invention

The present general inventive concept relates to a semiconductor device, and more particularly, to a printed circuit board to mount a semiconductor chip, a semiconductor package, and a card apparatus and a system using the semiconductor package.

2. Description of the Related Art

For high performance and portable convenience, an electronic product is miniaturized with high capacity. Accordingly, in a semiconductor package used in such electronic product, the size of a substrate should be reduced while disposing more external terminals on the substrate. For example, a ball grid array (BGA) type semiconductor package may be suitable to a miniaturized high performance product.

In such BGA type semiconductor package, the external terminals may be adhered to lands disposed on the back surface of the substrate. For example, in the case of a solder mask defined (SMD) type semiconductor package, the boundaries of the lands are covered by a solder mask layer, and the external terminals are adhered to the top surface of the exposed lands. Alternatively, in the case of a non-solder mask defined (NSMD) type semiconductor package, the boundaries of the lands are exposed by the solder mask layer, and the external terminals are adhered not only to the boundaries of the lands but also to wiring lines.

However, reliability of a conventional SMD or NSMD type semiconductor package is a problem.

Figure 14:
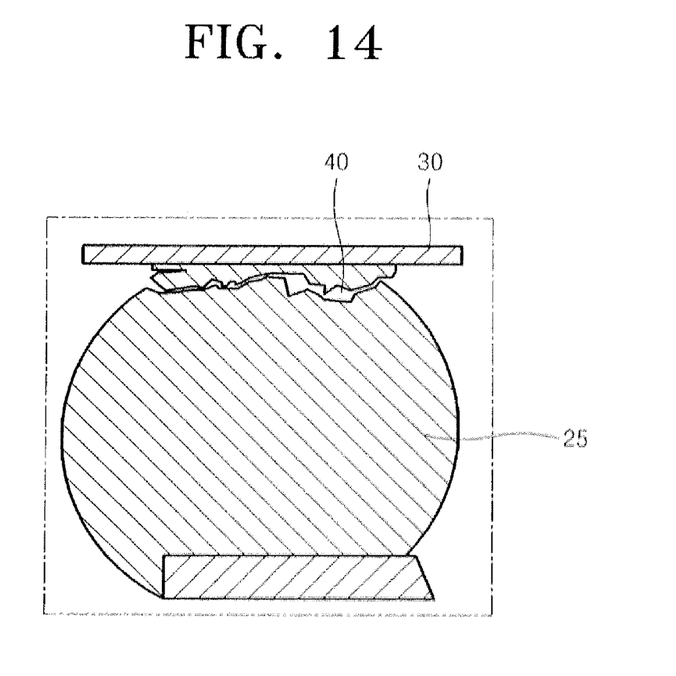
FIG. 14 is a photo illustrating adhesion reliability of an external terminal in a conventional SMD type semiconductor package.

FIG. 14 is a photo for describing adhesion reliability of an external terminal in a conventional SMD type semiconductor package. The top of the photo is the SMD type semiconductor package. Referring to FIG. 14, in the case of the SMD type semiconductor package, a crack 40 may be generated near an area where an external terminal 25 and a land 30 are adhered after a solder joint reliability (SJR) test. Accordingly, the adhesion reliability between the external terminal 25 and the land 30 may deteriorate.

Figure 15:
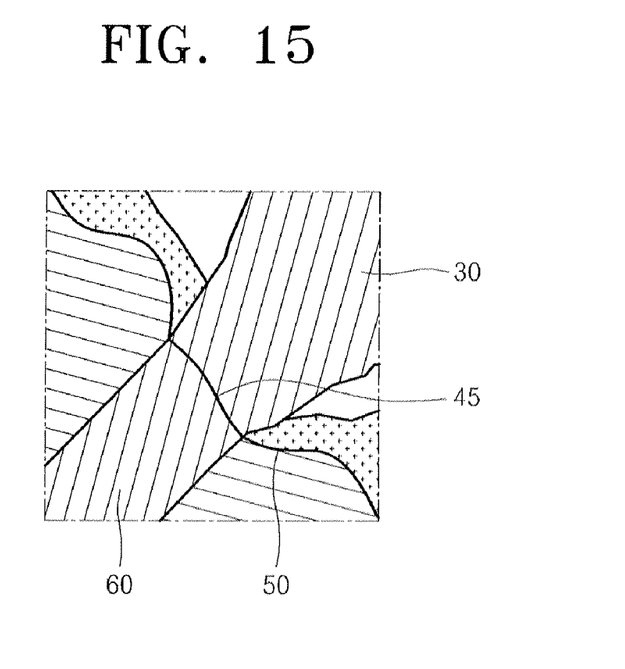
FIG. 15 is a photo illustrating reliability of an external terminal in a conventional NSMD type semiconductor package.

FIG. 15 is a photo for describing reliability of an external terminal in a conventional NSMD type semiconductor package. Referring to FIG. 15, in the case of the NSMD type semiconductor package, a crack 45 may be generated in a wiring line 60. Such crack 45 may be generated in an interface area 50 of an external terminal (not shown) covering a land 30. Moreover in the case of the NSMD type semiconductor package, the density of the external terminal decreases since the adhering area of the external terminal increases, and the wiring line 60 is difficult to be densely disposed. Accordingly, advantages and disadvantages of the SMD type and NSMD type semiconductor packages should be suitably harmonized.

SUMMARY OF THE INVENTION

The present general inventive concept provides a printed circuit board and a semiconductor package, which can obtain high reliability by using a high capacity semiconductor chip.

The present general inventive concept also provides a card apparatus and a system using the semiconductor package.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a printed circuit board including a substrate having a first surface and a second surface, at least one land disposed on the second surface of the substrate, and including a circumference with a plurality of first group arcs, and a mask layer to cover the second surface of the substrate and including at least one opening to expose the at least one land, wherein a portion of the at least one land may be covered by the mask layer, and a sidewall of another portion of at least one land may be exposed by the at least one opening, and the circumference of the at least one opening may include a plurality of second group arcs, and a radius of the outermost arc from among the plurality of first group arcs may be equal to a radius of the outermost arc from among the plurality of second group arcs.

The foregoing and/or other aspects and utilities of the present general inventive concept may also be achieved by providing a semiconductor package including a substrate having a first surface and a second surface, a semiconductor chip mounted on the first surface of the substrate, at least one land disposed on the second surface of the substrate, and whose circumference includes a plurality of first group arcs; a mask layer covering the second surface of the substrate and including at least one opening that exposes the at least one land, and at least one external terminal disposed on the at least one land, wherein a portion of the at least one land may be covered by the mask layer, and a sidewall of another portion of the at least one land may be exposed by the at least one opening, and the circumference of the at least one opening may include a plurality of second group arcs, and a radius of the outermost arc from among the plurality of first group arcs may be equal to a radius of the outermost arc from among the plurality of second group arcs.

The semiconductor package may further include a wiring line connected to the at least one land, wherein the wiring line may be covered by the mask layer.

The plurality of first group arcs may include a first arc having a first radius and a second arc having a second radius that is larger than the first radius, and a plurality of second group arcs may include a third arc having a third radius and a fourth arc having a fourth radius that is larger than the third radius.

The first and fourth arcs may be disposed in an outward direction from the center of the substrate. The centers of the second and fourth arcs may be identical, and the second radius may be equal to the fourth radius.

The foregoing and/or other aspects and utilities of the present general inventive concept may also be achieved by providing a semiconductor package including a substrate having a first surface and a second surface, a semiconductor chip mounted on the first surface of the substrate, a plurality of first lands disposed on a first area of the second surface of the substrate, and whose circumferences each include a plurality of first group arcs, a plurality of second lands disposed on a second area of the second surface of the substrate, a mask layer to cover the second surface of the substrate and including a plurality of first openings to expose the plurality of first lands and a plurality of second openings exposing the plurality of second lands, a plurality of first external terminals on the plurality of first lands, and a plurality of second external terminals on the plurality of second lands, wherein a portion of each of the plurality of first lands may be covered by the mask layer, and a sidewall of another portion of each of the plurality of first lands may be exposed by each of the plurality of first openings, and the circumference of each of the plurality of first openings may include a plurality of second group arcs, and a radius of the outermost arc from among the plurality of first group arcs may be equal to a radius of the outermost arc from among the plurality of second group arcs.

The first area of the second surface may be positioned to surround the second area of the second surface, and the second area of the second surface may be positioned to surround the center of the second surface.

The sizes of the plurality of second openings may be smaller than the sizes of the plurality of second lands so that the circumferences of the plurality of second lands are covered by the mask layer.

The foregoing and/or other aspects and utilities of the present general inventive concept may also be achieved by providing a card apparatus including: a memory including the semiconductor package as described above, and a controller to control the memory and to transceive data with the memory.

The foregoing and/or other aspects and utilities of the present general inventive concept may also be achieved by providing a system including a memory including the semiconductor package as described above, a processor to transceiver data with the memory via a bus, and an input/output unit to communicate with the processor via the bus.

The foregoing and/or other aspects and utilities of the present general inventive concept may also be achieved by providing a printed circuit board including a substrate having a first surface and a second surface, at least one land disposed on the second surface of the substrate, and whose circumference includes a plurality of first group arcs, and a mask layer to cover the second surface of the substrate, and including at least one opening that exposes at least one land, wherein a portion of the at least one land may be covered by the mask layer, and a sidewall of another portion of at least one land may be exposed by the at least one opening, a circumference of the at least one opening may include a plurality of second group arcs, and a radius of the outermost arc from among the plurality of first group arcs may be equal to a radius of the outermost arc from among the plurality of second group arcs.

The printed circuit board may further include a wiring line connected to the at least one land, wherein the wiring line is covered by the mask layer.

The plurality of first group arcs may include a first arc having a first radius and a second arc having a second radius that is larger than the first radius, and a plurality of second group arcs comprises a third arc having a third radius and a fourth arc having a fourth radius that is larger than the third radius.

The centers of the second and fourth arcs may be identical, and the second radius may be equal to the fourth radius.

The foregoing and/or other aspects and utilities of the present general inventive concept may also be achieved by providing a printed circuit board including a substrate, at least one land disposed on a first portion of the substrate, and including a surface formed with first and second portions, and including a side surface formed with first and second side surfaces extended from the surface toward the substrate, and a mask layer formed to cover the a second portion of the substrate, the second portion of the land, and the second side surface of the land, and having third and fourth side surfaces to define an opening to expose the first portion of the land and the first side surface of the land therethrough.

The mask layer may not be formed on the first portion of the land and the first side surface of the land.

The mask layer may include a first portion formed on the second portion of the substrate and a second portion formed on the second portion of the land, and the second portion of the land may be disposed between the first portion of the substrate and the second portion of the mask layer.

The first side surface of the land may be spaced apart from a center portion of the land, the second side surface of the land may be spaced apart from the center by a second distance, the third side surface of the mask layer may be disposed on the surface of the land and spaced apart from the center by a third distance, and the fourth side surface of the mask layer may be disposed on the substrate to face the first side surface of the land and spaced apart from the center by a fourth distance.

A difference between the first distance and the fourth distance may be greater than a difference between the second distance and the third distance.

The first side surface may be disposed at a first angle around a center of the land, the second side surface may be disposed at a second angle around the center, and the first angle may be greater than the second angle.

The printed circuit board may further include an external terminal formed on the land to cover the first portion and the first side surface of the land, and the fourth side surface of the mask layer may be spaced apart from the first side surface of the land to form a portion of the opening, and the external terminal may be disposed in the portion of the opening.

The printed circuit board may further include at least one another land disposed on a third portion of the substrate and having another surface and another side surface extended from the another surface toward the substrate, wherein the first portion of the substrate may be closer to a center of the substrate than the third portion.

The first side surface of the land may be spaced apart from the fourth side surface of the mask layer to form a gap therebetween such that the first side surface of the land is exposed, the second side surface of the land may be covered by the mask layer and is spaced part from the third side surface of the mask layer to cover the second portion of the land, and the second side surface and the third side surface may be disposed closer to the center of the substrate than the gap The foregoing and/or other aspects and utilities of the present general inventive concept may also be achieved by providing a semiconductor package including a printed circuit board including a substrate, at least one land disposed on a first portion of the substrate, and including a surface formed with first and second portions, and including a side surface formed with first and second side surfaces extended from the surface toward the substrate, a mask layer formed to cover the a second portion of the substrate, the second portion of the land, and the second side surface of the land, and having third and fourth side surfaces to define an opening to expose the first portion of the land and the first side surface of the land therethrough, and a semiconductor chip mounted on a surface of the substrate to be electrically connected to the land of the printed circuit board.

The foregoing and/or other aspects and utilities of the present general inventive concept may also be achieved by providing an apparatus including a single housing having a control unit, and a semiconductor package disposed in the single housing, and including a printed circuit board including a substrate, at least one land disposed on a first portion of the substrate, and including a surface formed with first and second portions, and including a side surface formed with first and second side surfaces extended from the surface toward the substrate, and a mask layer formed to cover the a second portion of the substrate, the second portion of the land, and the second side surface of the land, and having third and fourth side surfaces to define an opening to expose the first portion of the land and the first side surface of the land therethrough, a semiconductor chip mounted on a surface of the substrate to be electrically connected to the land of the printed circuit board, and an external terminal formed on the first portion of the substrate and electrically connected to the control unit such that the control unit communicates with an external apparatus to transmit data stored in the semiconductor chip to the external apparatus.

The foregoing and/or other aspects and utilities of the present general inventive concept may also be achieved by providing a method of forming a printed circuit board and a semiconductor package, the method including connecting a semiconductor chip on a substrate, forming at least one land to be disposed on a first portion of the substrate, and the land including a surface formed with first and second portions, and a side surface formed with first and second side surfaces extended from the surface toward the substrate, forming a wire line on the substrate to be connected to the second portion of the land, forming a mask layer formed to cover the second portion of the substrate, the wire line, the second portion of the land, and the second side surface of the land, and the mask layer having third and fourth side surfaces to define an opening to expose the first portion of the land and the first side surface of the land therethrough, and forming an external terminal on the first portion of the land and the first side surface of the land; and mounting the external terminal of the semiconductor package to a control unit to form an apparatus within a single housing.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Unless defined otherwise, technical and scientific terms used herein have the same meaning as is commonly understood by one of skill in the art to which this general inventive concept belongs. For example, an external terminal in embodiments of the present general inventive concept may be used to connect a semiconductor package and an electronic product, and transmit a signal between them.

In embodiments of the present invention, the sameness of dimensions is not limited to a mathematical viewpoint but means that the dimensions are substantially the same in terms of engineering. For example, when radiuses of two arcs are the same, it means that the radiuses are substantially the same within a process margin range while manufacturing the two arcs.

While describing a number of an element in embodiments of the present general inventive concept, the expression "at least one" means that the number of the element may be one or more. Accordingly, "at least one" may be used in the same manner as "one or more" or "one or plural".

Figure 1:
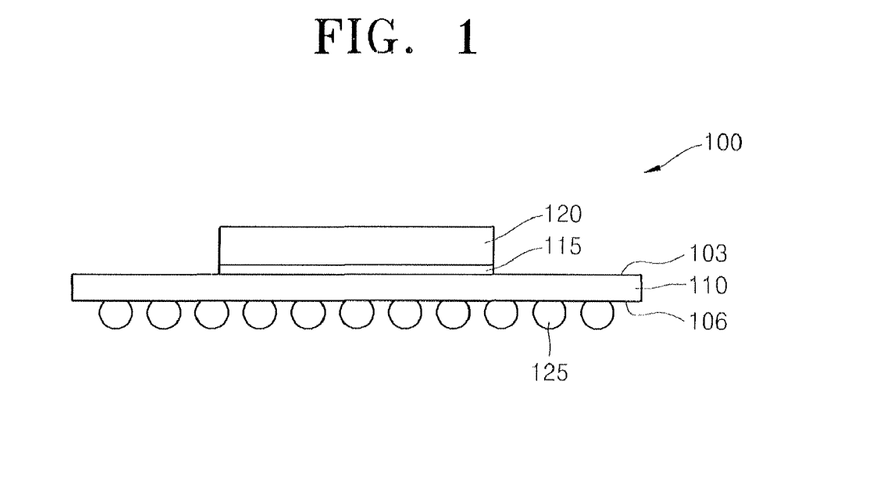
FIG. 1 is a cross-sectional view illustrating a semiconductor package according to an embodiment of the present general inventive concept.

FIG. 1 is a cross-sectional view illustrating a semiconductor package 100 according to an embodiment of the present general inventive concept.

Referring to FIG. 1, a substrate 110 includes a first surface 103 and a second surface 106. For example, the substrate 110 may have a plate shape, and the first and second surface 103 and 106 may be opposite surfaces, such as a front surface and a back surface. The substrate 110 may be rigid or flexible, and may include a suitable insulator, for example one or plural insulation resins.

A semiconductor chip 120 is mounted on the first surface 103 of the substrate 110. For example, the semiconductor chip 120 is attached to the substrate 110 by using an adhesive member 115. The semiconductor chip 120 may be formed of a memory device and/or a logic device, but the type of the semiconductor chip 120 is not limited in the present general inventive concept. Moreover, in a modified example of the current embodiment, a plurality of semiconductor chips (not shown) may be further mounted on the first surface 103 of the substrate 110.

The semiconductor chip 120 is electrically connected to the substrate 110 by using a suitable connecting member, such as a bonding wire (not illustrated). A molding member (not illustrated) is further disposed on the first surface 103 of the substrate 110 to protect the semiconductor chip 120.

At least one external terminal, for example, a plurality of external terminal 125, is disposed on the second surface 106 of the substrate 110. The external terminals 125 are electrically connected to the semiconductor chip 120 via the substrate 110. Accordingly, the number of the external terminals 125 is suitably determined according to the type and capacity of the semiconductor chip 120. For example, the external terminals 125 may include conductive bumps, such as solder balls.

Arrangement and structure of the external terminal 125 will now be described in detail with reference to FIGS. 2 through 4.

Figure 2:
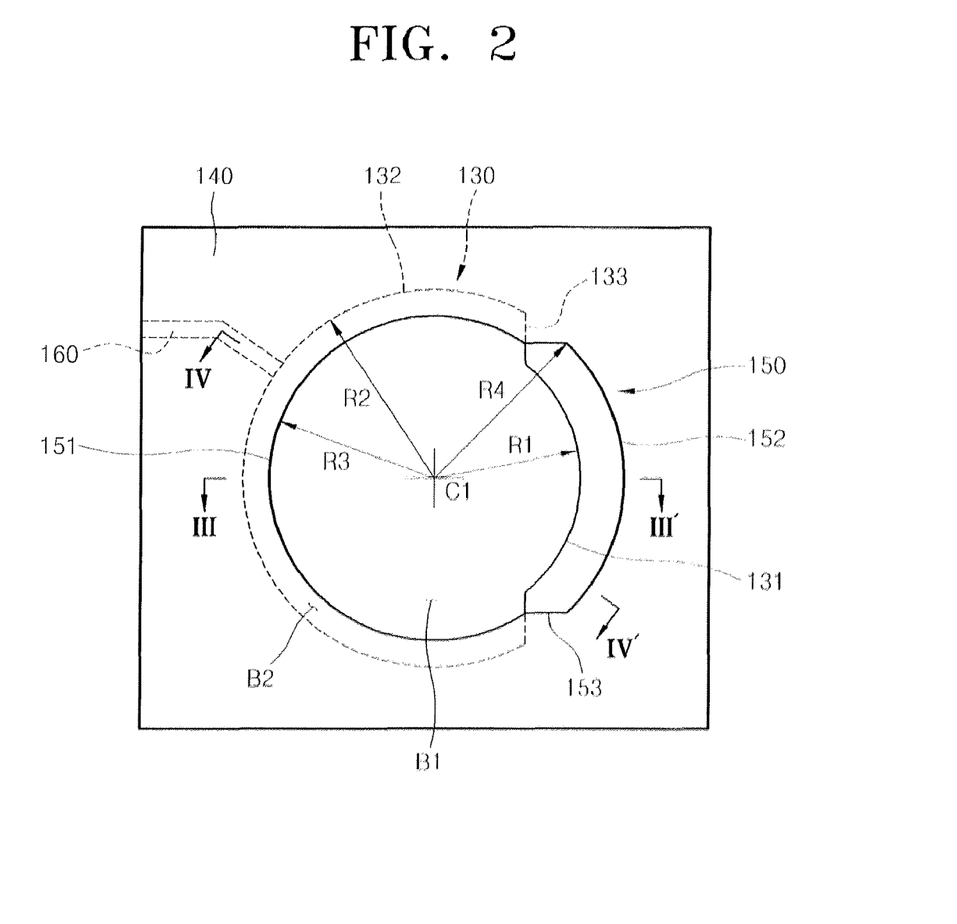
FIG. 2 is a plan view illustrating an exposure structure of a land in the semiconductor package of FIG. 1.

FIG. 2 is a plan view illustrating an exposure structure of a land 130 in the semiconductor package 100 of FIG. 1. FIG. 3 is a cross-sectional view taken along a line II-II' of FIG. 2. FIG. 4 is a cross-sectional view taken along a line IV-IV' of FIG. 2. The external terminal 125 is not illustrated in FIG. 2 for convenience, but is illustrated in FIGS. 3 and 4.

Figure 3:
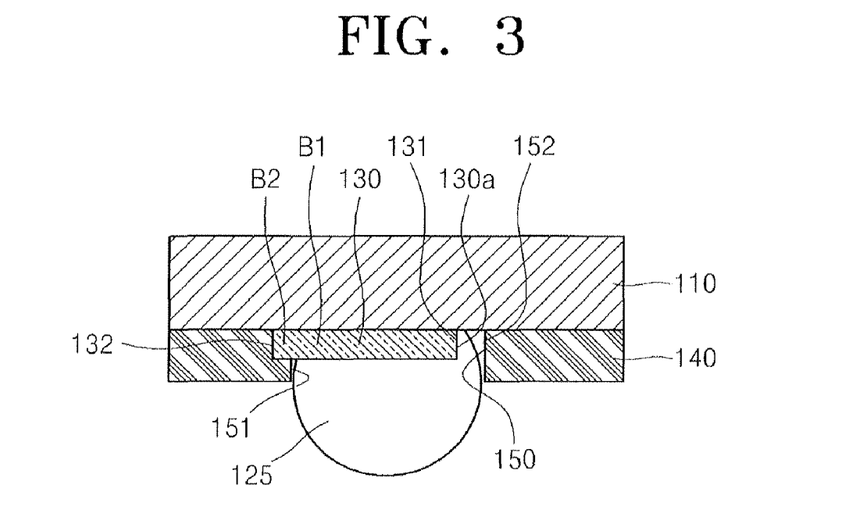
FIG. 3 is a cross-sectional view taken along a line III-III' of FIG. 2.
Figure 4:
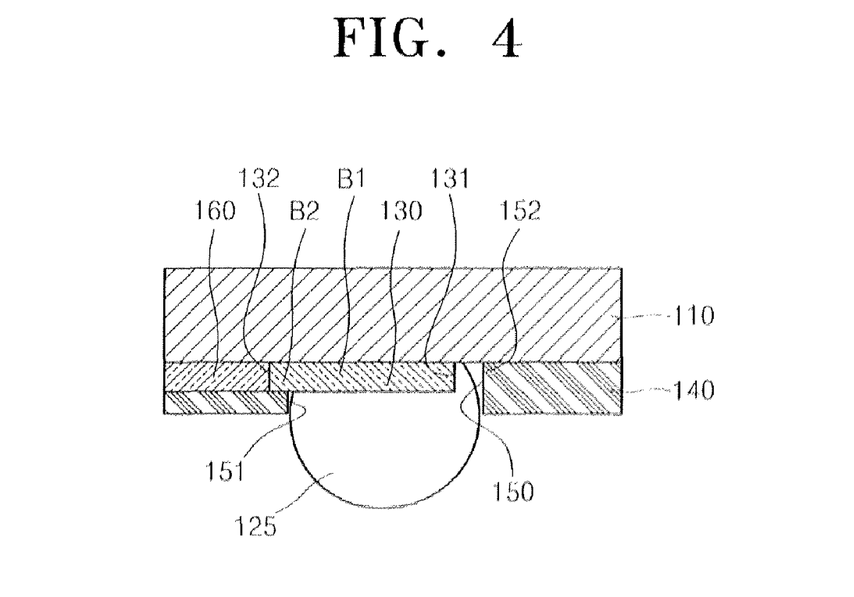
FIG. 4 is a cross-sectional view taken along a line IV-IV' of FIG. 2.

Referring to FIGS. 2 through 4, the external terminal 125 is disposed on a portion of the land 130. For example, a portion B1 of the land 130 may be exposed by an opening 150 of a mask layer 140, and the external terminal 125 may be attached to the exposed portion B1 of the land 130 such that the external terminal 125 is electrically connected to the semiconductor 120 through the land 130 and/or the bonding wire. Another portion B2 of the land 130 is covered by the mask layer 140 so as not to directly contact the external terminal 125. The portion B1 and the another portion B2 may be disposed on a same surface, and the external terminal 125 may be disposed on the portion of the portion B1 of the land 130.

In detail, the land 130 is disposed on the second surface 106 of the substrate 110 as illustrated in FIG. 1, and the circumference of the land 130 includes side surfaces corresponding to a plurality of first group arcs, such as a first arc 131 and a second arc 132. The first arc 131 has a first radius R1, and the second art 132 has a second radius R2. The second radius R2 is larger than the first radius R2. The first and second arcs 131 and 132 are connected to each other by one or more first connection lines 133. The first connection lines 133 may be straight lines or curves. The side surfaces of the circumference of the land 130 may be extended from the surface of the portion B1 and the another portion B2 of the land 130. The side surfaces and the surface may have an angle. Accordingly, in the current embodiment, the circumference of the land 130 is confined by the first and second arcs 131 and 132 and the first connection lines 133.

A wiring line 160 is connected to the second arc 132. The wiring line 160 may be an input/output line of the land 130. The land 130 and the wiring line 160 may be formed of the same conductive material, such as a copper and noble metal layer, but the present general inventive concept is not limited thereto. For example, the land and the wiring line 160 may be formed of different conductive materials.

The mask layer 140 is formed on the second surface 106 of the substrate 110, and substantially exposes the land 130 through an opening 150. The opening 150 may be defined by the side surface of the land 130 and a side surface (wall) of the mask layer 140. For example, a circumference of the opening 150 may include side surfaces of the mask layer 140 corresponding to a plurality of second group arcs, such as a third arc 151 and a fourth arc 152. The third arc 151 has a third radius R3 and a fourth arc 152 has a fourth radius R4. The fourth radius R4 is larger than the third radius R3. The third and fourth arcs 151 and 152 are connected to each other by second connection lines 153. The second connection lines 153 may be straight lines or curves. Accordingly in the current embodiment, the circumference of the opening 150 is confined by the third and fourth arcs 151 and 152, and the second connection lines 153.

The opening 150 may include a first opening defined by the side surfaces of the mask layer 140 to expose the portion B1 of the land 130 and a second opening defined by the side surface of the mask layer 140 and the side surface of the land 130 which is disposed to face the surface of the mask layer 140. The second opening may be referred to as a gap formed between the side surface of the mask layer 140 and the side surface of the land 130. The side surface of the mask layer 140 corresponding to the first opening is disposed on a same side of the side surface of the mask layer 140 corresponding to the second opening.

It is possible that another gap can be formed between the external terminal 125 and the corresponding side surfaces of the mask layer 140.

It is also possible that the external terminal 125 can be disposed in the first opening and the second opening of the opening 150 to cover the portion B1 of the land 130 and/or the side surface of the land 130. Since the portion B of the land 130 has an angle with the side surface of the land 130 to form a corner portion therebetween, the external terminal 125 can be attached to the land 130 through the corner portion, the portion B1 of the land 130, and/or the side surface of the land 130 in two directions thereof.

The third arc 151 of the opening 150 is disposed in the second arc 132 of the land 130, and the first arc 131 of the land 130 is disposed in the fourth arc 152 of the opening 150. In other words, the second radius R2 is larger than the third radius R3, and the forth radius R4 is larger than the first radius R1. Accordingly, the portion B1 of the land 130 is exposed by the opening 150, and the another portion B2 of the land 130 is covered by the mask layer 140. Moreover, a sidewall 130a of the land 130 is exposed by the opening 150. The wiring lines 160 are covered by the mask layer 140.

Accordingly, the land 130 is an NSMD type in the first arc 131 and an SMD type in the second arc 132. In other words, the land 130 has a complex structure where SMD and NSMD are combined. Consequently, the external terminal 125 is adhered to the portion B1 of the land 130 exposed by the opening 150, and moreover, further adhered to the sidewall 130a of the land 130. Thus, the external terminal 125 is attached to the sidewall 130a of the land 130 while not directly contacting the wiring line 160.

By using such complex structure, disadvantages of the SMD type and NSMD type can both be overcome. In other words, since the external terminal 125 does not directly contact the wiring line 160, a crack is not generated in the wiring line 160 unlike the NSMD type. Also, since the sidewall 130a of the land 130 directly contacts the external terminal 125, adhesion reliability between the land 130 and the external terminal 125 increases. As a result, higher solder joint reliability (SJR) can be obtained compared to the SMP type.

A ratio of the SMD type second arc 132 and the NSMD type first arc 131 can be appropriately adjusted. For example, in order to obtain sufficient SJR, the length of the first arc 131 is ⅓ or more of the length of the second arc 132, or the length of the fourth arc 152 is ⅓ or more of the length of the third arc 151. Moreover, in order to suitably maintain the exposed area of the land 130, the length of the first arc 131 is equal to or shorter than the length of the second arc 132, or the length of the fourth arc 152 is equal to or shorter than the length of the third arc 151.

Meanwhile, the structure of the land 130 needs to be optimized not only considering the reliability but also the size of the external terminal 125. The second arc 132 may be the outermost arc of the land 130, the fourth arc 152 may be the outermost arc of the opening 150, and the second arc 132 and the fourth arc 152 may be portions of the same circumference of the mask layer 140. In other words, centers C1 of the second and the fourth arcs 132 and 152 may substantially be the same, and the second radius R2 and the fourth radius R4 may substantially be the same. Here, the same not only means in terms of mathematic, but also in terms of engineering where an error during a manufacturing process or a difference due to a margin is considered to be in the same range.

Moreover, the third radius R3 is larger than the first radius R1. The larger third radius R3 contributes to enlarging the size of the exposed portion B1 of the land 130. The centers C1 of the first and third arcs 131 and 151 are substantially the same. In this case, the centers C1 of the first, second, third, and fourth arcs 131, 132, 151, and 152 are substantially the same, and thus the structures of the land 130 and the opening 150 are simplified. However, the present invention is not limited thereto. For example, the centers of the first and third arcs 131 and 151 may not be the same.

Since the second and fourth arcs 132 and 152 are on the same circumference, an adhesive part of the external terminal 125 is located inside the circumference formed of the second and fourth arcs 132 and 152. Accordingly, the structure of the land type can be complex, while the size of the external terminal 125 is small. Thus, plural numbers of external terminals 125 may be closely disposed on the second surface 106 of the substrate 110, and accordingly, the semiconductor package 100 can obtain high reliability as the semiconductor package 100 is easily applied to a packaging of the high capacity semiconductor chip 120.

Figure 5:
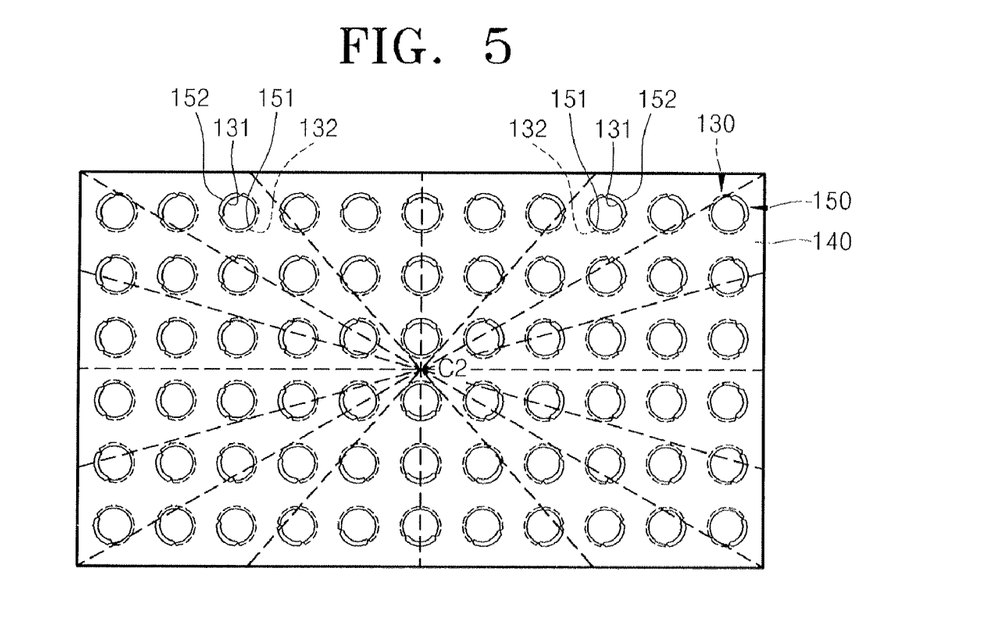
FIG. 5 is a plan view illustrating a land arrangement in the semiconductor package of FIG. 1 according to an embodiment of the present general inventive concept.

FIG. 5 is a plan view illustrating arrangement of a plurality of lands 130 in the semiconductor package 100 of FIG. 1 according to an embodiment of the present general inventive concept. In FIG. 5, the external terminals 125 are omitted for convenience of description.

Referring to FIG. 5, the lands 130 are disposed on the second surface 106 of the substrate 100. The lands 130 may have a radial arrangement. For example, the first and fourth arcs 131 and 152 of each land 130 may be disposed in an outward direction from a center C2 of the substrate 110 as illustrated in FIG. 5. The second and third arcs 132 and 151 of each land 130 may be disposed in an inward direction toward the center C2 of the substrate 110 as illustrated in FIG. 5. In other words, the first and fourth arcs 131 and 152 of each land 130 corresponding to an NSMD type part is disposed in the outward direction from the center C2 of the substrate 110, and the second and third arcs 132 and 151 of each land 130 corresponding to an SMD type part is disposed in the inward direction of the center C2 of the substrate 110.

Such radial arrangement contributes to increasing SJR of the semiconductor package 100. Generally, during an SJR test, stress increases towards the outside of the substrate 110. Accordingly, the SJR can be effectively increased by arranging the NSMD type part outside the substrate 110.

Figure 6:
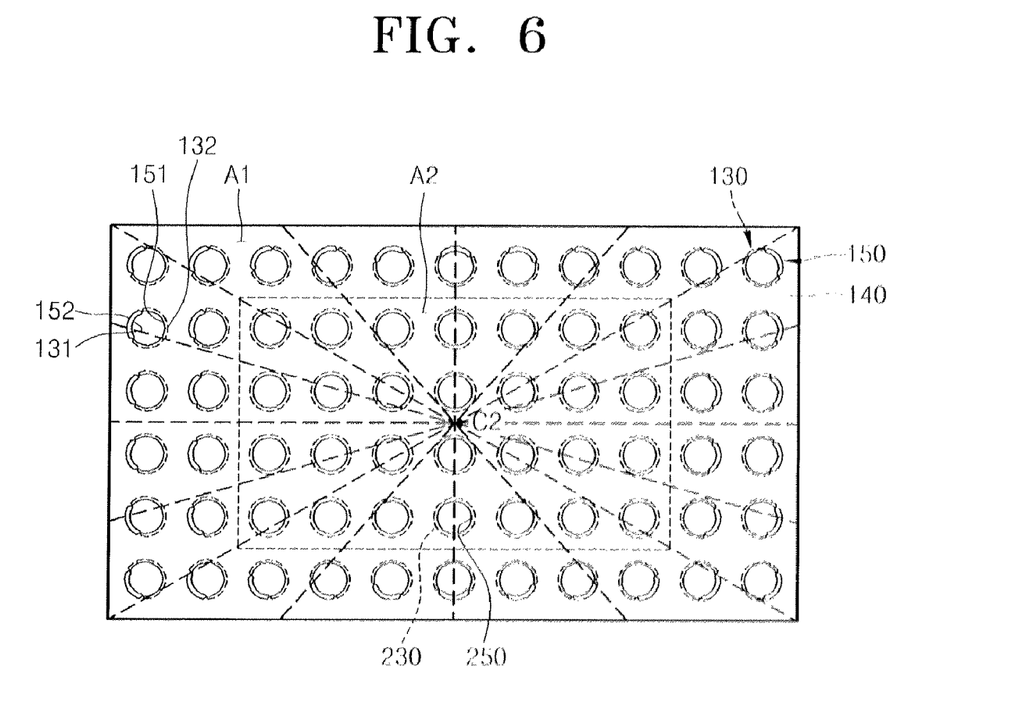
FIG. 6 is a plan view illustrating a land arrangement in the semiconductor package of FIG. 1 according to another embodiment of the present general inventive concept.
Figure 7:
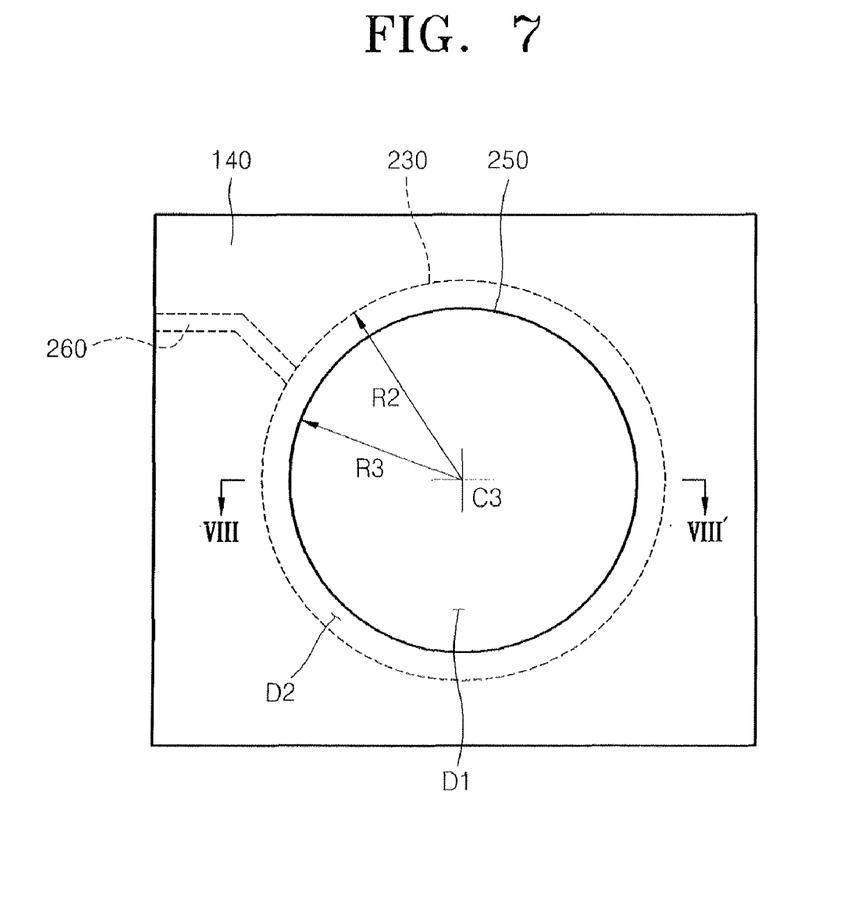
FIG. 7 is a plan view illustrating an exposure structure of a second land illustrated in FIG. 6.
Figure 8:
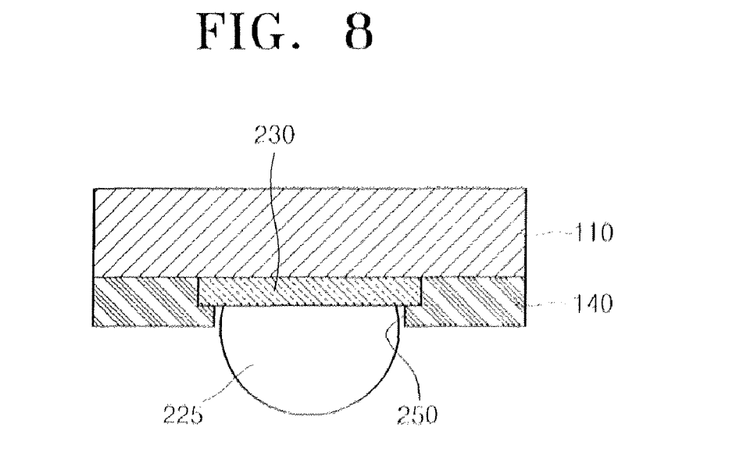
FIG. 8 is a cross-sectional view taken along a line VIII-VIII' of FIG. 7.

FIG. 6 is a plan view illustrating a land arrangement in the semiconductor package 100 of FIG. 1 according to another embodiment of the present general inventive concept. FIG. 7 is a plan view illustrating an exposure structure of a second land 230 illustrated in FIG. 6. FIG. 8 is a cross-sectional view taken along a line VIII-VIII' of FIG. 7.

Referring to FIGS. 1 and 6, the second surface 106 of the substrate 110 includes a first area A1 and a second area A2. For example, the first area A1 may surround the second area A2. The center C2 of the substrate 110 may be disposed in the second area A2, and the second area A2 surrounds the center C2 of the substrate 110, and the first area A1 includes the outermost boundary of the substrate 110.

A plurality of first lands 130 is disposed in the first area A1. Each first land 130 of FIG. 6 may be the same as the land 130 illustrated in FIGS. 2 through 4, and so has the same reference numeral. The same is applied for first opening 150 of the first lands 130. As illustrated in FIG. 5, in the first lands 130, the first and fourth arcs 131 and 152 are disposed in the outward direction from the center C2 of the substrate 110. In other words, an NSMD type part is disposed in the outward direction from the center C2 of the substrate 110 and an SMD type part is disposed in a direction of the center C2 of the substrate 110.

First external terminals (not illustrated) are disposed on the corresponding first lands 130. The first external terminals are equal to the external terminals 125 of FIGS. 3 and 4.

Referring to FIGS. 6 through 8, a plurality of second lands 230 is disposed in the second area A2. Second openings 250 are defined by side walls of the mask layer 140 to substantially expose a portion of the second lands 230. For example, the size of the second openings 250 is smaller than the size of the second lands 230, and thus the circumference of the second lands 230 are covered by the mask layer 140.

For example, the second lands 230 may have the second radius R2 from a center C3, and the second openings 250 may have the third radius R3 from the center C3. Accordingly, a portion D1 of the second lands 230 are exposed by the second openings 250, and other portion D2 of the second lands 230 are covered by the mask layer 140. In other words, the second lands 230 have an SMD type.

Second external terminals 225 are disposed on the corresponding second lands 230. For example, the second external terminals 225 may be adhered to the second lands 230 exposed by the second openings 250.

The second opening 250 may be defined by side surfaces of the mask layer 140, and the second external terminals 225 may be disposed in the second opening 250 and may have a gap with side surfaces of the mask layer 140.

According to the current embodiment, the SMD type second lands 230 are disposed on the second area A2 of the second surface 106 of the substrate 110, and thus generation of cracks on the wiring lines 160 of FIG. 2 can be prevented. Moreover, the first lands 130 having the complex structure of SMD type and NSMD type are disposed on the first area A1 of the second surface 106 of the substrate 110, and thus SJR can be increased. In addition, since the size of the first lands 130 having the complex structure is not larger than the size of the SMD type second lands 230, the land arrangement according to the current embodiment is applied to the packaging of the high capacity semiconductor chip 120 so as to increase reliability.

Figure 9:
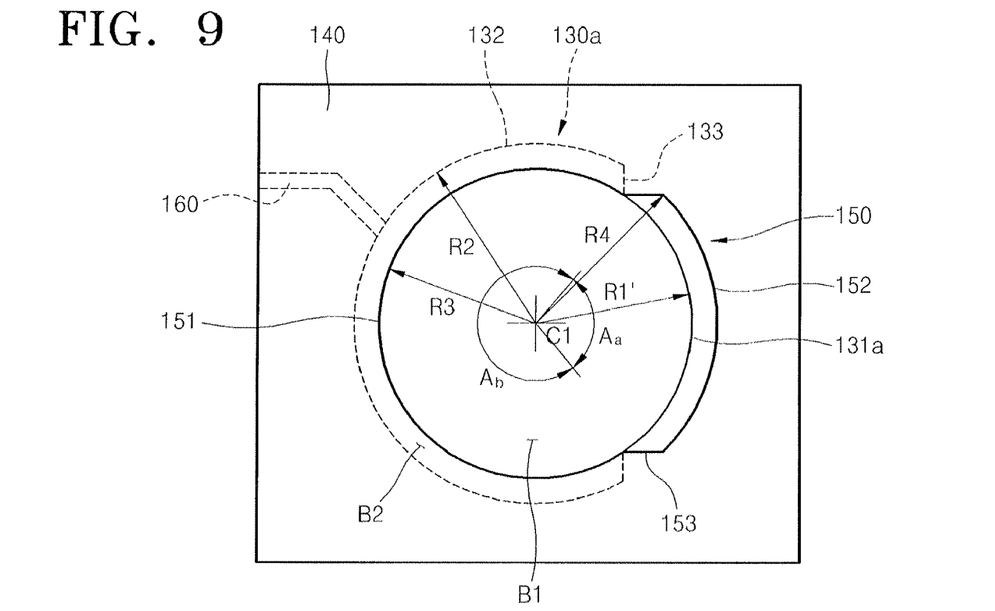
FIG. 9 is a plan view illustrating a modified example of the exposure structure of a land in FIG. 2.

FIG. 9 is a plan view illustrating a modified example of the exposure structure of a land in FIG. 2.

Referring to FIG. 9, the size of a land 130a is larger than the size of the land 130 of FIG. 2. For example, a first arc 131a has a first radius R1' that is equal to the third radius R3. Accordingly, a distance between the first arc 131a and the fourth arc 152 is smaller than that of FIG. 2. As a result, the size of the land 130a may be larger than the land 130. However, the effect of the NSMD type may deteriorate compared to FIG. 2.

The first arc 131a and/or the fourth arc 152 may be disposed within an angle Aa with respect to the center C1, and the second arc 132 and/or the third arc 151 may be disposed within another angle Ab with respect to the center C1. Here, the angle Aa is smaller than the another angle Ab.

Figure 10:
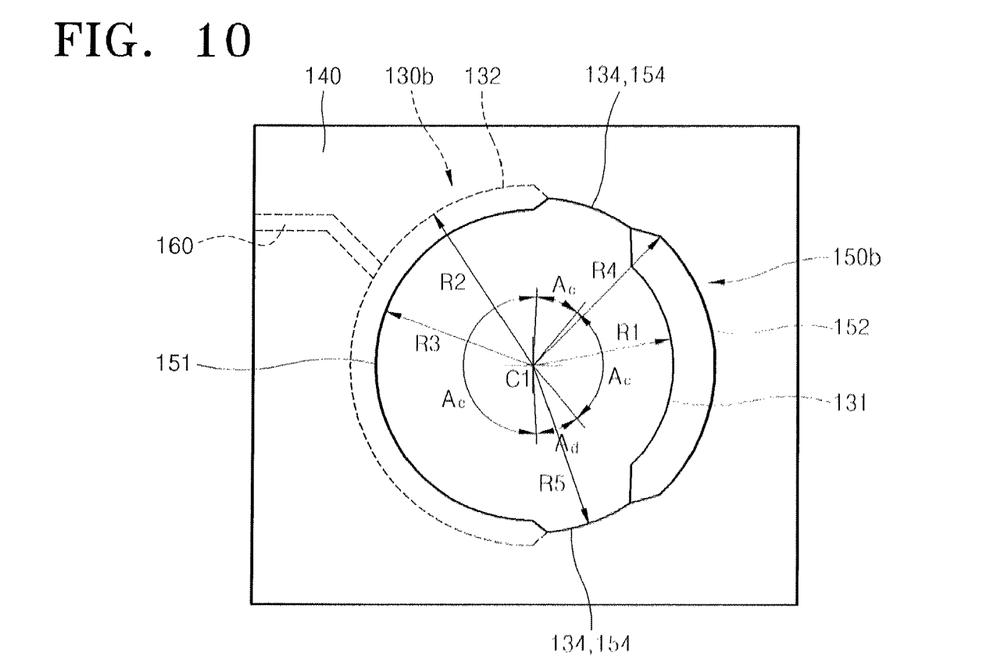
FIG. 10 is a plan view illustrating another modified example of the exposure structure of a land in FIG. 2.

FIG. 10 is a plan view illustrating another modified example of the exposure structure of a land in FIG. 2.

Referring to FIG. 10, a land 130b further includes a plurality of arcs, such as a pair of fifth arcs 134, besides the first and second arcs 131 and 132, and an opening 150b further includes a plurality of arcs, such as a pair of sixth arcs 154, besides the third and fourth arcs 151 and 152. The fifth and sixth arcs 134 and 154 have the same fifth radius R5 from the center C1, and may overlap with each other. The fifth radius R5 is smaller than the second and fourth radiuses R2 and R4, and larger than the first and third radiuses R1 and R3.

The first arc 131 and/or the fourth arc 152 may be disposed within an angle Ac with respect to the center C1, the second arc 132 and/or the third arc 151 may be disposed within another angle Ae with respect to the center C1, and the fifth arc 134 and/or the sixth arc 154 may be disposed within anther angle Ad. Here, the angle Ad may be larger than the angle Ac and/or angle Ad. It is possible that the angle Ad is smaller than the another angle Ac.

Although FIG. 10 illustrates the fifth arc 134 and the sixth arc 154 to be disposed between the first and second arcs 131 and 132 and/or between the third and fourth arcs 151 and 152, it is possible that the fifth arc 134 and the sixth arc 154 can be disposed in middle portions of the first arc 131 and the fourth arc 152 to divide the first arc 131 and the fourth arc 152 into two arcs. In this case, the fifth arc 134 and the sixth arc 154 can be disposed between two opposite portions of the first arc 131 and/or two opposite portions of the fourth arc 152.

The number and locations of the fifth arcs 134 may vary in the land 130b. For example, any one of the pair of the fifth arcs 134 may be omitted and the omitted fifth arc 134 may be maintained as FIG. 2 or 9.

Hereinabove, the semiconductor package 100 according to the embodiments of the present general inventive concept is described with reference to FIGS. 1 through 10. However, the aspect of the present invention is not limited to the semiconductor package 100, and can be applied to a printed circuit board for forming the semiconductor package 100. The printed circuit board according to the present invention corresponds to the structure of the semiconductor package 100 described with reference to FIGS. 1 through 10, excluding the adhesive member 115, the semiconductor chip 120, and the external terminals 125. Optionally, the printed circuit board may include the external terminals 125.

Figure 11:
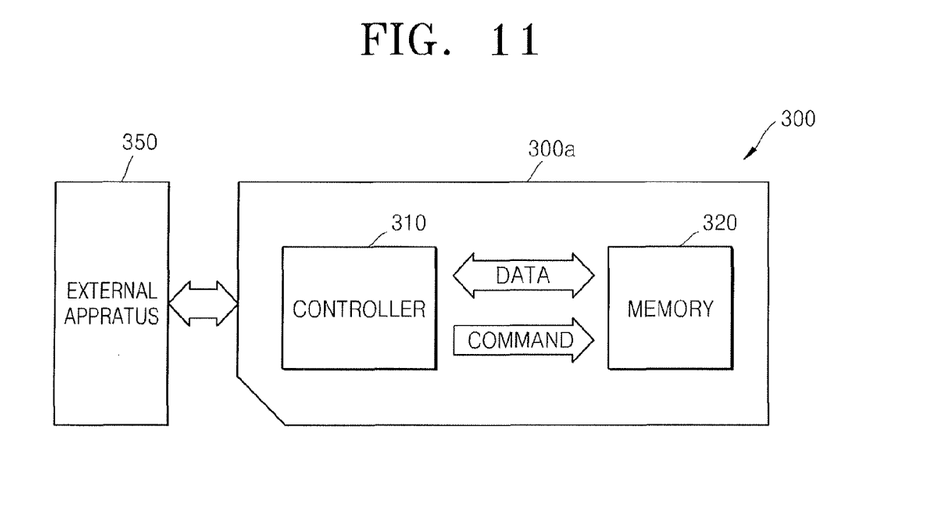
FIG. 11 is a schematic diagram illustrating a card apparatus according to an embodiment of the present general inventive concept.

FIG. 11 is a schematic diagram illustrating a card apparatus 300 according to an embodiment of the present general inventive concept.

The card apparatus 300 may communicate with an external apparatus 350, such as a reader, through a wire or wireless connection such that data can be transmitted and received between the card apparatus 300 and the external apparatus 350. The card apparatus 300 may be a portable card apparatus to transmit and/or receive data to and/or from at least one of external apparatuses 350.

Referring to FIG. 11, the card apparatus 300 includes a controller 310 and a memory 320 that exchange electric signals. The controller 310 controls the memory to transmit data stored in the memory to the external apparatus 350. For example, when a command is transmitted from the controller 310 to the memory 320 through a command bus, data is transceived (transmitted and/or received) between the memory 320 and the controller 310 through a data bus. The memory 320 may be a DRAM, an SRAM, a flash memory, a phase change memory, or the like, and may include the semiconductor package 100 of FIGS. 1 through 10. Such card apparatus 300 may be used as a memory device, such as a multimedia card (MMC) or a secure digital (SD) card.

When the memory 320 includes the semiconductor package 100 of FIGS. 1 through 10, the external terminals 125 of the semiconductor package 100 can be electrically connected to corresponding signal terminals of the data bus and the command bus. The card apparatus 300 may include a housing 300a to accommodate the controller 310 and the memory 320 mounted therein. The housing 300a may be a single housing.

Since the card 300 can reliably install the high capacity memory 320, the card 300 is used in a high capacity memory device.

Figure 12:
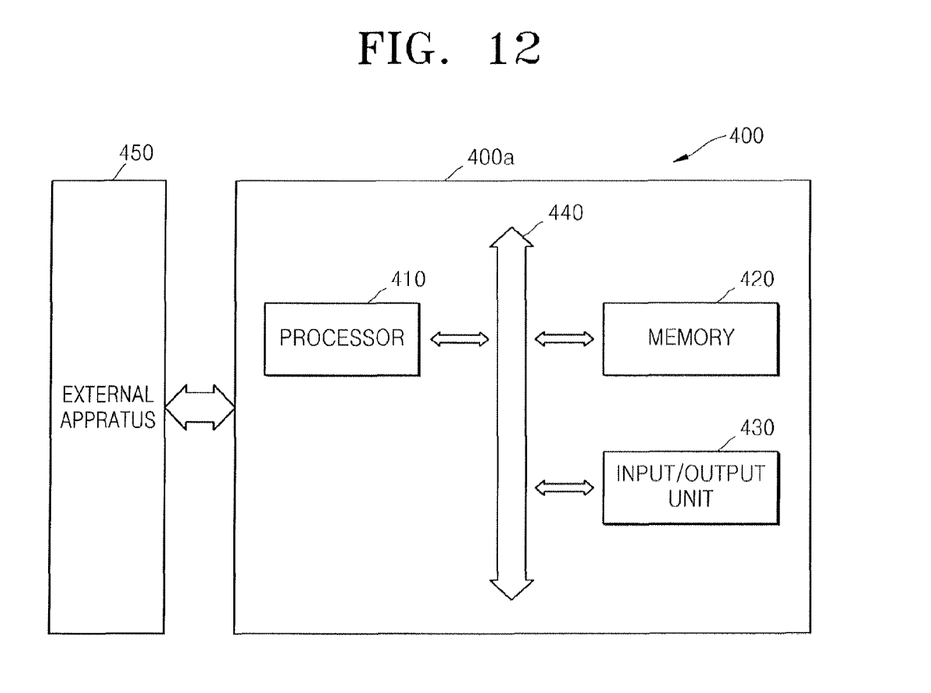
FIG. 12 is a block diagram illustrating a system according to an embodiment of the present general inventive concept.

FIG. 12 is a block diagram illustrating a system 400 according to an embodiment of the present invention.

The system 400 may communicate with an external apparatus 450, such as a reader, through a wire or wireless connection such that data can be transmitted and received between the system 400 and the external apparatus 450. The system 400 may be a portable apparatus to transmit and/or receive data to and/or from at least one of external apparatuses 450.

Referring to FIG. 12, a processor 410, an input/output unit 430, and a memory 420 communicate with each other by using a bus 440. The processor 410 may be a control unit to execute a program, and controls the system 400. The input/output device 430 is used to input or output data of the system 400. The processor 410 and the input/output device 430 may be referred to as the control unit to transmit data stored in the memory 420 to the external apparatus 450. Accordingly, the system 400 exchanges data with an external apparatus, such as a personal computer or a network, by using the input/output unit 430.

The memory 420 may be a DRAM, an SRAM, a flash memory, a phase change memory, or the like, and may include the semiconductor package 100 of FIGS. 1 through 10. For example, the memory 420 may store codes and data for operating the processor 410.

When the memory 420 includes the semiconductor package 100 of FIGS. 1 through 10, the external terminals 125 of the semiconductor package 100 can be electrically connected to corresponding signal terminals of the bus. The system 400 may include a housing 400a to accommodate the processor 410, the memory 420, and the input/output unit 430 mounted therein. The housing 400a may be a single housing.

The system 400 can reliably install the high capacity memory 420, and thus can be used in a high capacity electronic system. For example, the system 400 may be used in a computer, a mobile phone, an MP3 player, a navigator, a sold state disk (SSD), or household appliances.

In Table 1, SJR of a semiconductor package according to an experimental example of the present invention and SJR of a semiconductor package according to a comparative example are compared. In the comparative example, the exposure structure of a land is an SMD type, and in the experimental example, the exposure structure of a land is a complex structure where an SMD type and an NSMD type are combined, i.e. like the embodiment of FIG. 6. The SJR is measured while repeatedly applying a thermal cycle (TC) between 0 to 125° C.

TABLE 1

| Sample | Number | TC 300 | TC 600 | TC 800 | TC 1000 | TC 1200 | TC 1300 | TC 1400 | TC 1700 |
|---|---|---|---|---|---|---|---|---|---|
| Experimental | 12 | 0 | 0 | 0 | 0 | 0 | 0 | 0 | 1 |

TABLE 1-continued

| Sample | Number | TC 300 | TC 600 | TC 800 | TC 1000 | TC 1200 | TC 1300 | TC 1400 | TC 1700 |
|---|---|---|---|---|---|---|---|---|---|
| Example | 12 | 0 | 0 | 0 | 0 | 0 | 0 | 1 | 0 |
| Comparative Example | 12 | 0 | 0 | 0 | 1 | 4 | X | X | X |
| Example | 10 | 0 | 1 | 1 | 3 | X | X | X | X |

Referring to Table 1, in the comparative example, a defect starts to occur when the TC exceeds 600 times, and after 1200 times, the SJR test is stopped (marked in "X"). However in the experimental example, a defect does not occur even when the TC reaches 1300 times, and the SJR test continues until 1700 times. Accordingly, it can be seen that the experimental example has the higher SJR than the comparative example.

Figure 13:
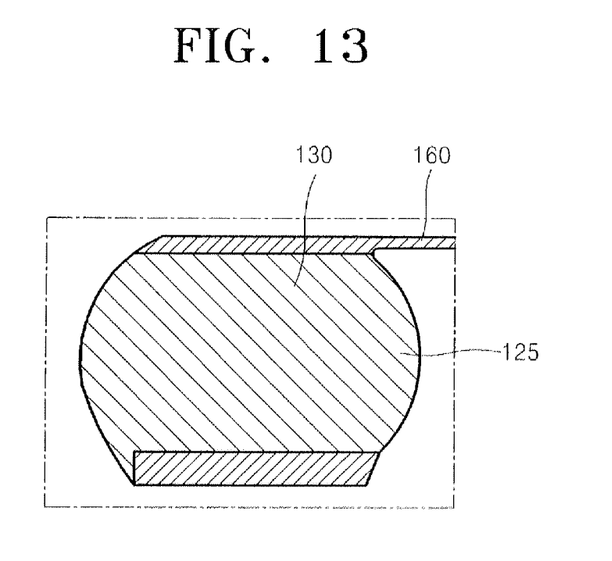
FIG. 13 is a photo illustrating an adhesion reliability of an external terminal in a semiconductor package according to an experimental example of the present general inventive concept.

FIG. 13 is a photo illustrating an adhesion reliability of the external terminal 125 in the semiconductor package 100 according to an experimental example of the present general inventive concept. Referring to FIG. 13, it can be seen that any crack is not generated between the external terminal 125 and the land 130, and even in the wiring line 160.

Figure 16:
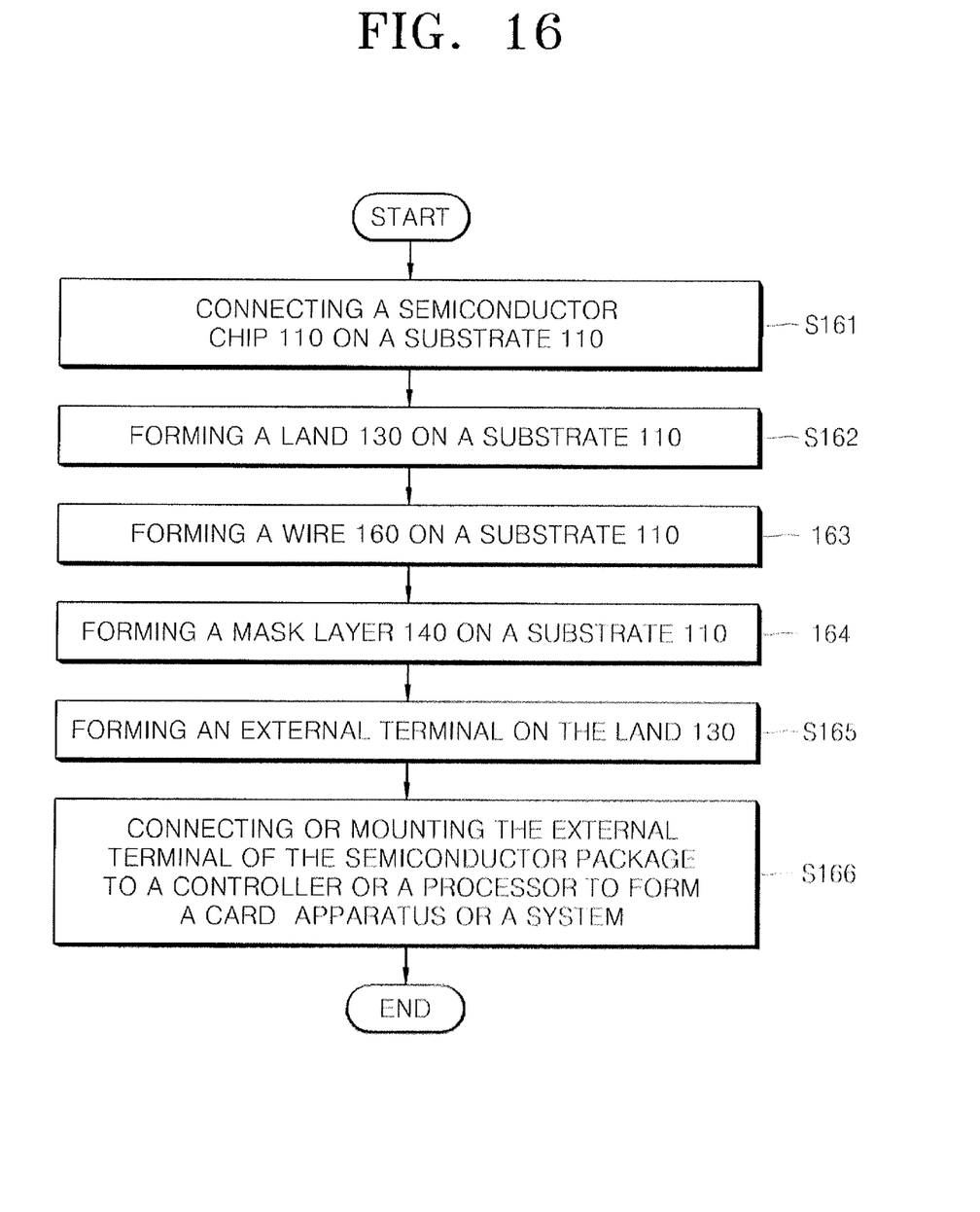
FIG. 16 is a flowchart illustrating a method of forming at least one of a semiconductor package, a card apparatus, and a system according to an embodiment of the present general inventive concept.

A method of forming the printed circuit board and the semiconductor package of FIGS. 1 through 10 is now described with reference to FIG. 16 according to an embodiment of the present general inventive concept. The method includes connecting a semiconductor chip 110 on a substrate 110 at operation S161, forming a land 130 on a substrate 110 at operation S162, forming a wire line 160 on a substrate 110 at operation 163, forming a mask layer 140 on a substrate 110 at operation 164, forming an external terminal on the land 130 at operation S165, and connecting or mounting the external terminal of the semiconductor package to a controller or a processor to form a card apparatus or a system at operation S166. Here, the operation S161 of connecting the semiconductor chip 110 on the substrate 110 can be performed after operation S165. It is possible that operations S161 through S165 can be performed in a single manufacturing process and can be separated from the operation S166. However, the present general inventive concept is not limited thereto. The operations S161 through S166 can be performed as a single manufacturing process.

According to the printed circuit board and the semiconductor package of the present general inventive concept, disadvantages of the SMD type and NSMD type can both be overcome. In other words, since the external terminal does not directly contact the wiring line, a crack is not generated in the wiring line unlike the NSMD type. Also, since one sidewall of the land directly contacts the external terminal, the adhesion reliability of the land and the external terminal increases, and thus higher SJR can be obtained than the SMD type.

In addition, according to the printed circuit board and the semiconductor package of the present general inventive concept, the size of the external terminal is maintained small while employing the complex structure of the SMD and NSMD types. Accordingly, plural external terminals can be closely disposed on the substrate. Thus, the semiconductor package according to the present invention can obtain high reliability by being applied to the packaging of a high capacity semiconductor chip.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims.

What is claimed is:

1. A semiconductor package comprising:
    a substrate having a first surface and a second surface;
    a semiconductor chip mounted on the first surface of the substrate;
    at least one land disposed on the second surface of the substrate, and whose circumference includes a plurality of first group arcs;
    a mask layer covering the second surface of the substrate and including at least one opening that exposes the at least one land; and
    at least one external terminal disposed on the at least one land,
    wherein a portion of the at least one land is covered by the mask layer, and a sidewall of another portion of the at least one land is exposed by the at least one opening, and
    the circumference of the at least one opening includes a plurality of second group arcs, and a radius of the outermost arc from among the plurality of first group arcs is equal to a radius of the outermost arc from among the plurality of second group arcs.

2. The semiconductor package of claim 1, wherein the at least one external terminal is adhered to the at least one land exposed by the at least one opening.

3. The semiconductor package of claim 2, wherein the at least one external terminal is attached to the sidewall of the another portion of the at least one land exposed by the at least one opening.

4. The semiconductor package of claim 1, further comprising:
    a wiring line connected to the at least one land,
    wherein the wiring line is covered by the mask layer.

5. The semiconductor package of claim 1, wherein:
    the plurality of first group arcs comprises a first arc having a first radius and a second arc having a second radius that is larger than the first radius; and
    a plurality of second group arcs comprises a third arc having a third radius and a fourth arc having a fourth radius that is larger than the third radius.

6. The semiconductor package of claim 5, wherein:
    the third arc is disposed inside the second arc; and
    the first arc is disposed inside the fourth arc.

7. The semiconductor package of claim 6, wherein the first and fourth arcs are disposed in an outward direction from the center of the substrate.

8. The semiconductor package of claim 5, wherein:
    the centers of the second and fourth arcs are identical; and
    the second radius is equal to the fourth radius.

9. The semiconductor package of claim 8, wherein the third radius is larger than the first radius.

10. The semiconductor package of claim 8, wherein the length of the fourth arc is in a range from ⅓ to 1 of the length of the second arc.

11. The semiconductor package of claim 1, wherein the at least one land comprises a plurality of lands, the at least one opening comprises a plurality of openings that each exposes the plurality of lands, and the at least one external terminal comprises a plurality of external terminals on the plurality of lands.

12. The semiconductor package of claim 1, wherein:
the land comprises:
- a plurality of first lands disposed on a first area of the second surface of the substrate, and whose circumferences each include a plurality of first group arcs, and
- a plurality of second lands disposed on a second area of the second surface of the substrate;

the at least one opening comprises:
- a plurality of first openings exposing the plurality of first lands, and
- a plurality of second openings exposing the plurality of second lands;

the external terminal comprises:
- a plurality of first external terminals on the plurality of first lands, and
- a plurality of second external terminals on the plurality of second lands;

a portion of each of the plurality of first lands is covered by the mask layer, and a sidewall of another portion of each of the plurality of first lands is exposed by each of the plurality of first openings; and the circumference of each of the plurality of first openings includes a plurality of second group arcs, and a radius of the outermost arc from among the plurality of first group arcs is equal to a radius of the outermost arc from among the plurality of second group arcs.

13. The semiconductor package of claim 12, wherein:
the first area of the second surface is positioned to surround the second area of the second surface; and
the second area of the second surface is positioned to surround the center of the second surface.

14. The semiconductor package of claim 13, wherein the first area of the second surface comprises the outermost second surface.

15. The semiconductor package of claim 13, wherein the sizes of the plurality of second openings are smaller than the sizes of the plurality of second lands so that the circumferences of the plurality of second lands are covered by the mask layer.

16. The semiconductor package of claim 12, further comprising:
a plurality of first wiring lines connected to the plurality of first lands,
wherein the first wiring lines are covered by the mask layer.

17. The semiconductor package of claim 12, further comprising:
a plurality of second wiring lines connected to the plurality of second lands,
wherein the second wiring lines are covered by the mask layer.

18. The semiconductor package of claim 12, wherein the another portion of each of the plurality of first lands whose sidewalls are exposed by the plurality of first openings is disposed in an outward direction from the center of the substrate.

19. A card apparatus comprising:
a memory unit including a semiconductor package comprising:
- a substrate having a first surface and a second surface;
- a semiconductor chip mounted on the first surface of the substrate;
- at least one land disposed on the second surface of the substrate, and whose circumference includes a plurality of first group arcs;
- a mask layer covering the second surface of the substrate and including at least one opening that exposes the at least one land; and
- at least one external terminal disposed on the at least one land,
- wherein a portion of the at least one land is covered by the mask layer, and a sidewall of another portion of the at least one land is exposed by the at least one opening, and
- the circumference of the at least one opening includes a plurality of second group arcs, and a radius of the outermost arc from among the plurality of first group arcs is equal to a radius of the outermost arc from among the plurality of second group arcs; and a controller to control the memory unit to transceiver data with the memory.

20. A system comprising:
a memory unit including a semiconductor package comprising
- a semiconductor chip mounted on the first surface of the substrate;
- at least one land disposed on the second surface of the substrate, and whose circumference includes a plurality of first group arcs;
- a mask layer covering the second surface of the substrate and including at least one opening that exposes the at least one land; and
- at least one external terminal disposed on the at least one land,
- wherein a portion of the at least one land is covered by the mask layer, and a sidewall of another portion of the at least one land is exposed by the at least one opening, and
- the circumference of the at least one opening includes a plurality of second group arcs, and a radius of the outermost arc from among the plurality of first group arcs is equal to a radius of the outermost arc from among the plurality of second group arcs;

a processor to transceive data with the memory unit via a bus; and
an input/output unit to communicate with the processor via the bus.

* * * * *